US008645810B2

(12) United States Patent
Sharon et al.

(10) Patent No.: US 8,645,810 B2
(45) Date of Patent: Feb. 4, 2014

(54) FAST DETECTION OF CONVERGENCE OR DIVERGENCE IN ITERATIVE DECODING

(75) Inventors: Eran Sharon, Rishon Lezion (IL); Idan Alrod, Herzliya (IL); Ariel Navon, Revava (IL); Omer Fainzilber, Even-Yehuda (IL); Simon Litsyn, Giv'at Shmuel (IL)

(73) Assignee: Sandisk Technologies Inc., Plano, TX (US)

( * ) Notice: Subject to any disclaimer, the term of this patent is extended or adjusted under 35 U.S.C. 154(b) by 89 days.

(21) Appl. No.: 13/194,952

(22) Filed: Jul. 31, 2011

(65) Prior Publication Data

US 2013/0031447 A1    Jan. 31, 2013

(51) Int. Cl.
*H03M 13/03* (2006.01)

(52) U.S. Cl.
USPC ............................ 714/794; 714/780; 714/755

(58) Field of Classification Search
USPC ......... 714/794, 795, 769, 755, 791, 796, 780, 714/746, 786
See application file for complete search history.

(56) References Cited

U.S. PATENT DOCUMENTS

| 6,718,508 | B2 | 4/2004 | Lodge et al. |
| 7,139,959 | B2 | 11/2006 | Hocevar |
| 7,296,216 | B2 | 11/2007 | Shen et al. |
| 7,388,781 | B2* | 6/2008 | Litsyn et al. ............. 365/185.09 |
| 7,401,283 | B2 | 7/2008 | Shen et al. |
| 7,484,158 | B2 | 1/2009 | Sharon et al. |
| 7,559,008 | B1 | 7/2009 | Patapoutian |
| 7,664,008 | B2 | 2/2010 | Stolpman et al. |
| 7,770,090 | B1 | 8/2010 | Kons et al. |
| 7,844,877 | B2 | 11/2010 | Litsyn et al. |
| 7,945,854 | B2* | 5/2011 | Medynskiy et al. .......... 715/243 |
| 2002/0010892 | A1 | 1/2002 | Lodge et al. |
| 2004/0109507 | A1 | 6/2004 | Kanter et al. |
| 2005/0204271 | A1 | 9/2005 | Sharon et al. |
| 2005/0283707 | A1 | 12/2005 | Sharon et al. |
| 2006/0107179 | A1 | 5/2006 | Shen et al. |
| 2007/0253479 | A1 | 11/2007 | Mukherjee |
| 2008/0008083 | A1 | 1/2008 | Stolpman et al. |

(Continued)

FOREIGN PATENT DOCUMENTS

WO WO 2007/082626 A2    7/2007
WO WO 2007/133404 A2    11/2007

(Continued)

OTHER PUBLICATIONS

Sharon et al., *An Efficient Message-Passing Schedule for LDPC Decoding*, Proceedings of the 23$^{rd}$ IEEE Convention, Tel-Aviv, Israel, Sep. 6-7, 2004, pp. 223-226.

*Primary Examiner* — Fritz Alphonse
(74) *Attorney, Agent, or Firm* — Alston & Bird LLP

(57) ABSTRACT

A termination indication is computed during an iteration of an iterative decoding of a representation of a codeword according to a schedule. The termination indication is tested to see if the decoding has converged or is not likely to converge. The testing of the termination indication shows convergence or lack of likelihood thereof even if a codeword bit estimate was flipped during an immediately preceding traversal of the schedule. Preferably, the termination indication includes an error correction syndrome weight, a zero value whereof indicates convergence, and the computing of the termination indication includes, in response to the flipping of a codeword bit estimate, flipping the error correction syndrome bits that are influenced by that codeword bit estimate.

35 Claims, 7 Drawing Sheets

(56) References Cited

U.S. PATENT DOCUMENTS

| | | |
|---|---|---|
| 2008/0077839 A1 | 3/2008 | Gross et al. |
| 2008/0235559 A1 | 9/2008 | Yang |
| 2008/0294960 A1 | 11/2008 | Sharon et al. |
| 2008/0294970 A1 | 11/2008 | Gross et al. |
| 2008/0316069 A1* | 12/2008 | Draper et al. .................. 341/51 |
| 2009/0150754 A1 | 6/2009 | Dohmen et al. |
| 2009/0319860 A1 | 12/2009 | Sharon et al. |
| 2009/0319861 A1 | 12/2009 | Sharon et al. |
| 2010/0042890 A1 | 2/2010 | Gunnam |
| 2010/0042891 A1 | 2/2010 | Gunnam et al. |
| 2010/0042897 A1 | 2/2010 | Han et al. |
| 2010/0042905 A1 | 2/2010 | Gunnam et al. |
| 2010/0042906 A1 | 2/2010 | Gunnam et al. |
| 2010/0088575 A1 | 4/2010 | Sharon et al. |
| 2010/0169734 A1 | 7/2010 | Gamage et al. |
| 2010/0192043 A1 | 7/2010 | Alrod et al. |
| 2010/0318872 A1 | 12/2010 | Wang |

FOREIGN PATENT DOCUMENTS

| | | |
|---|---|---|
| WO | WO 2008/034254 A1 | 3/2008 |
| WO | WO 2008/080272 A1 | 7/2008 |
| WO | WO 2008/141453 A1 | 11/2008 |
| WO | WO 2008/142683 A2 | 11/2008 |
| WO | WO 2009/078514 A1 | 6/2009 |
| WO | WO 2009/143375 A2 | 11/2009 |
| WO | WO 2009/156871 A1 | 12/2009 |
| WO | WO 2009/156883 A1 | 12/2009 |
| WO | WO 2009/156935 A1 | 12/2009 |

* cited by examiner

FAST DETECTION OF CONVERGENCE OR DIVERGENCE IN ITERATIVE DECODING

FIELD AND BACKGROUND OF THE INVENTION

The present invention relates to iterative decoding and, more particularly, to a fast method of detecting when to terminate the decoding, either because the iterations have converged to a valid codeword or because the iterations are likely to not converge to a valid codeword, and a decoder for implementing the method.

Flash memory has become increasingly popular in recent years. Flash memory is used in numerous applications including mobile phones, digital cameras, MP players and many other applications. A major emerging application is the use of flash memory as Solid State Disc (SSD). In order to be cost efficient, it is desirable to implement such memories using high density Multi-Level Cell (MLC) memories, and to minimize the required redundancy that is needed for ensuring data reliability and integrity. This requires usage of advanced Error Correction Coding (ECC) schemes, such as state of the art iterative coding schemes based on Low-Density Parity-Check (LDPC) or Turbo codes.

Error correction codes are commonly used in memories in order to ensure data reliability and integrity, by dealing with errors that are introduced by the physical medium during its programming or reading or during the storage time. An error correction code is a set of codewords that satisfy a given set of constraints. One commonly used class of error correction codes is the class of binary linear block codes, in which the code is defined through a set of parity-check constraints on the codeword bits. In other words, a binary linear block code is defined by a set of linear equations over the two-element field GF(2) that a valid codeword should satisfy. The set of linear equations can be conveniently described via a parity-check matrix H of M rows, such that each row of the matrix defines one parity-check constraint and a word C constitutes a valid codeword if and only if H·C=0 (over GF(2)). The vector S=H·C is commonly known as the syndrome vector associated with the word C. In the appended claims, this syndrome is called the "error correction" syndrome to distinguish it from a different syndrome, the "CRC" or "checksum" syndrome, that is defined below. Each element of the syndrome vector is associated with one of the parity check equations, and the value of the element is 0 for an equation that is satisfied by C and 1 for an equation that is not satisfied by C. The elements of the syndrome vector also are called "bits" of the syndrome vector herein. The syndrome weight ($W_S$) is the number of unsatisfied equations represented by the syndrome vector S. So, for a word to be a valid codeword the syndrome vector associated with the word must be all zeros and its syndrome weight must be 0.

State of the art error correction codes are based on iterative coding schemes, such as LDPC and Turbo codes. In iterative coding schemes, decoding is performed using an iterative algorithm that iteratively updates its estimates of the codeword bits until the algorithm converges to a valid codeword. The iteratively updated estimates can be either "hard" estimates (1 vs. 0) or "soft" estimates, which are composed of an estimate of the bit's value (1 or 0), together with some reliability measure of the estimate indicating the probability that the estimated value is correct. The most commonly used soft estimate is the Log Likelihood Ratio (LLR), the ratio of the probability of the bit being 0 to the probability of the bit being 1. A positive LLR means that the bit is estimated to be more likely to be 0 than 1. A negative LLR means that the bit is estimated to be more likely to be 1 than 0. The absolute value of the LLR is an indication of the certainty of the estimate. In the appended claims, that an estimate of a bit "flips" means that the value of the bit estimate changes: for example, a hard estimate changes from 0 to 1 or from 1 to 0, or the sign of a LLR changes from positive to negative or from negative to positive. (Similarly, in the appended claims, "flipping" a bit of a syndrome vector means changing the bit from 1 to 0 or from 0 to 1.) The decoder is initialized with initial a-priori (possibly "soft") estimates of the bits. These estimates are then processed and updated iteratively. The decoding can terminate after a fixed number of iterations. Alternatively, a convergence detection mechanism can terminate the decoding once all the parity check constraints are satisfied by the current bit estimates.

Another option for early decoding termination is by a "divergence" detection mechanism, which detects that the probability for decoder convergence is low and hence it is more efficient to terminate the current decoding attempt and retry decoding after updating the decoder initialization values. One option for performing such divergence detection is based on the current number of unsatisfied parity-check constraints being too high. Another option for divergence detection is based on the evolution of the number of unsatisfied parity-checks during decoding. In case of such early termination, the decoding may be repeated with updated initialization values, after changing certain parameters, such as the memory reading thresholds or reading resolution, such that the probability of successful decoding convergence in the repeated attempt is increased.

Referring now to the drawings, FIG. 1 shows a block diagram of an exemplary iterative decoder 10. The initial bit estimates are stored in a bit estimates RAM 12. A ROM 14 is used for storing the code description. For example, ROM 14 may store which bits participate in each parity check constraint (i.e. ROM 14 stores the parity check matrix H that defines the code). The bit estimates are read from bit estimates RAM 12 through a routing layer 16 into several processing units 18. Code description ROM 14 controls the routing of the bit estimates into processing units 18. Processing units 18 update the bit estimates based on the parity-check constraints that the bits should satisfy. A scratchpad RAM 20 may be used by processing units 18 for storing temporary data required for updating the bit estimates. The updating of the bit estimates is done iteratively, one or more bit estimates at a time, where an iteration may involve updating the bit estimates based on all the parity-check constraints that the bit estimates should satisfy (i.e. "traversing" code description ROM 14 once). Decoding can terminate after a predetermined number of iterations or according to a convergence signal generated by a convergence detection block 22, once convergence detection block 22 detects that all the parity check constraints are satisfied by the current bit estimates (for example, by testing whether the syndrome weight is zero).

More formally, a decoding "iteration" is defined herein as considering each of the parity-check equations that define the code, and updating the estimates of the codeword bits that are associated with each parity-check equation, according to a certain schedule, until all the parity check equations have been considered. For example, LDPC decoding usually is formulated as message passing among the nodes of a "Tanner graph" whose edges connect nodes that represent the codeword bits with nodes that represent parity-checks that the codeword bits should satisfy. Examples of message-passing schedules for LDPC decoding on a Tanner graph include the following:

1. Traverse all the parity-check nodes, passing messages from each parity-check node to the codeword bit nodes to which that parity-check node is connected by edges of the graph. Update the codeword bit estimates according to the messages received at the codeword bit nodes. Then traverse all the codeword bit nodes, passing messages from each codeword bit node to the parity-check nodes to which that codeword bit node is connected by edges of the graph. Update the parity-check bit estimates according to the messages received at the parity-check nodes.

2. Traverse all the codeword bit nodes, passing messages from each codeword bit node to the parity-check nodes to which that codeword bit node is connected by edges of the graph. Update the parity-check bit estimates according to the messages received at the parity-check nodes. Then traverse all the parity-check nodes, passing messages from each parity-check node to the codeword bit nodes to which that parity-check node is connected by edges of the graph. Update the codeword bit estimates according to the messages received at the codeword bit nodes.

3. Traverse all the parity-check nodes. At each parity-check node, pass messages to the parity-check node from the codeword bit nodes that are connected to is that parity check node by edges of the graph, update the parity-check bit estimate according to the messages received at the parity-check node, send messages back from the parity-check node to those codeword bit nodes, and update the codeword bit estimates at those codeword bit nodes according to the messages received from the parity check node.

4. Traverse all the codeword bit nodes. At each codeword bit node, pass messages to the codeword bit node from the parity-check nodes that are connected to that codeword bit node by edges of the graph, update the codeword bit estimate according to the messages received at the codeword bit node, send messages back from the codeword bit node to those parity-check nodes, and update the parity-check bit estimates at those parity-check nodes according to the messages received from the codeword bit node.

As defined herein, an "iteration" is not over until its associated schedule has been completed.

Flash memories intended for applications such as SSD and mobile require very high random I/O performance. During reading, this implies usage of very fast ECC decoders. In order to achieve fast decoding in iterative coding schemes a fast convergence detection apparatus is needed. The advantage of using convergence detection block 22 is that it leads to faster decoding time (due to early termination) and lower energy consumption by decoder 10.

One common method for convergence detection in iterative decoders is to compute the syndrome vector $S = H \cdot \hat{C}$ at the end of each decoding iteration (where $\hat{C}$ is the vector of bit estimates at the end of the iteration) and check whether all the parity-checks are satisfied (i.e. whether the syndrome weight is zero). The disadvantage of this approach is that dedicated processing is done at the end of each iteration in order to compute the syndrome vector. This prolongs the decoding time and comes at the expense of decoding iterations.

Another approach, commonly used in iterative decoders that are based on serial schedules in which the parity-check equations of the code are processed one after another, is to perform semi-on-the-fly convergence detection. According to this approach, a counter holding the number of satisfied parity-checks is maintained. At the beginning of decoding this counter is set to zero. During decoding the code's parity-checks are traversed serially and iteratively and the bit estimates are updated based on each of the parity-checks. As part of this decoding process, the syndrome bit of each parity-check is computed when the parity-check is traversed. If the syndrome bit is zero (i.e. the parity-check is satisfied) then the counter is incremented, otherwise, the counter is reset to zero. The counter is also reset to zero each time one of the codeword bits changes value, because previously computed syndrome bits are not valid anymore. Once the counter reaches M (recall that M is the number of parity-check equations that the codeword should satisfy, which is the dimension of H), convergence is detected and decoding is terminated.

This semi-on-the-fly convergence detection mechanism is very simple. However, its drawback is that it provides delayed convergence detection, as it detects the convergence a full iteration after the decoder has converged to a valid codeword. The reason is that we need to count a full number of satisfied parity-checks after the last bit to flip flips its value (as value flipping resets the counter). In a high-error scenario, such as decoding data read from a flash memory long after the data were stored and/or after the flash memory has endured many write/erase cycles, several iterations (e.g. ten or more iterations) normally are required for convergence, so adding one more iteration after the last bit flips adds no more than 10% to the convergence time. However, in low-error environments such as a fresh flash memory, one or two iterations normally suffice for decoding a codeword, so that adding a full iteration after the last bit flip can add a significant 50% to 100% to the decoding time.

SUMMARY OF THE INVENTION

The methods described herein improve upon the conventional methods by providing real-time, "on-the-fly", convergence testing. Such real-time convergence testing is very important for applications such as SSD and i-NAND that require high read throughputs. This is especially critical for random I/O performance, as in the random I/O scenario pipeline cannot be supported and all the operations (read, transfer and decode) are serialized. Hence, reaching the high random I/O targets of current SSD products requires very fast decoders. Moreover, usually, the random I/O performance is measured when the Flash memory is fresh (low cycling) and its error rate is low. In this case, a decoder can converge to a valid codeword after only one or two iterations. In this case using conventional convergence detection methods, such as the semi-on-the-fly convergence detection method described above, would introduce a delay of about one iteration, which would increase the decoding time by about 50% to 100%, which would degrade the random I/O performance to an unacceptable level.

Therefore, one embodiment provided herein is a method of decoding a representation of a codeword that includes a plurality of codeword bits, including: (a) during at least one iteration, of an iterative decoding algorithm, in which respective estimates of the codeword bits are updated according to a schedule, computing a termination indication of the algorithm; and (b) testing the termination indication to determine whether to terminate the decoding; wherein the testing of the termination indication shows whether to terminate the decoding despite at least one of the respective estimates of the codeword bits having flipped during an immediately preceding traversal of the schedule.

Another embodiment provided herein is a decoder, for decoding a representation of a codeword that includes a plurality of codeword bits, comprising circuitry for: (a) during at least one iteration, of an iterative decoding algorithm, in which respective estimates of the codeword bits are updated according to a schedule, computing a termination indication of the algorithm; and (b) testing the termination indication to determine whether to terminate the decoding; wherein the testing of the termination indication shows whether to terminate the decoding despite at least one of the respective estimates of the codeword bits having flipped during an immediately preceding traversal of the schedule.

Another embodiment provided herein is a method of decoding a representation of a codeword that includes a plurality of codeword bits, including: during each of at least one iteration of an iterative decoding algorithm: in response to a flipping of a respective estimate of one of the codeword bits: (a) updating a termination indication that is a function of a syndrome of the estimates of the codeword bits, the syndrome including a plurality of syndrome bits; and (b) testing the termination indication.

Another embodiment provided herein is a decoder, for decoding a representation of a codeword that includes a plurality of codeword bits, including circuitry for, during each of at least one iteration of an iterative decoding algorithm: in response to a flipping of a respective estimate of one of the codeword bits: (a) updating a termination indication that is a function of a syndrome of the estimates of the codeword bits, the syndrome including a plurality of syndrome bits; and (b) testing the termination indication.

The methods disclosed herein are methods of decoding a representation of a codeword that includes a plurality of codeword bits. What is decoded is only a "representation" of a codeword and not an actual codeword because what is decoded is a codeword that may have become contaminated with noise and so is no longer a valid codeword. For example, the primary intended application of the methods disclosed herein is to recover data that has been stored in a nonvolatile memory such as a flash memory as one or more codewords but that has changed due to degradation of the flash memory over time or that has been changed by the process of reading the data from the memory. Another example of an application of the methods disclosed herein is to correcting errors that accumulate in codewords transmitted via a noisy transmission channel. Indeed, if the input to the methods is a valid codeword, there is no need for decoding.

In a first basic method, during one or more iterations of an iterative decoding algorithm that follows a schedule as described above for updating estimates of the codeword bits, a termination indication of the algorithm is computed. That the termination indication is computed "during" the iteration means that at least some of the computations that produce the termination indication are performed before all the scheduled codeword bit estimate updates of the iteration have been completed. "Updating" a codeword bit estimate means performing operations on the estimate that are intended to improve the estimate. These operations may or may not flip the estimate. For example, updating a LLR estimate may only change the magnitude of the estimate without changing the sign of the estimate.

The termination indication can be a convergence indication that is tested to determine whether the algorithm has converged by producing a valid codeword or a divergence indication that is tested to determine whether the algorithm is likely to not converge. The computation of the termination indication is such that the testing shows whether to terminate the decoding despite one or more of the codeword bit estimates having flipped during a traversal of the schedule that immediately precedes the testing. A "traversal" of a schedule means starting at a point in the schedule and returning to that point in the schedule. If the point is at the start or at the end of the schedule then the traversal is equivalent to an iteration; otherwise, the traversal crosses a boundary between two iterations.

In the case of the termination indication being a convergence indication, this method is distinguished from the first conventional convergence detection method discussed above by computing the termination indication during the iteration rather than after the iteration. This method is distinguished from the second conventional convergence detection method discussed above by indicating convergence despite recent flips of one or more of the codeword bit estimates.

Preferably, if the testing of the termination indication indicates that the algorithm has converged, the decoding is terminated. Additionally or alternatively, if the testing of the termination indication indicates that the algorithm is likely to not converge, the decoding is terminated.

Preferably, testing of the termination indication during the iteration is effected at least whenever a codeword bit estimate is flipped.

In one embodiment, the computing of the termination indication includes OR-ing all of a plurality of bits of an error correction syndrome.

If the codeword is a codeword of a code, such as a binary linear block code, for which an error correction syndrome of the codeword bit estimates is defined, then preferably the termination indication includes the weight of the error correction syndrome. The testing of the termination indication includes comparing the weight of the error correction syndrome to a threshold. For convergence detection, the threshold is zero.

Most preferably, the computing of the termination indication includes, in response to one of the codeword bit estimates being flipped, flipping every bit of the error correction syndrome that is influenced by that codeword bit estimate. An error correction syndrome bit is influenced by a codeword bit estimate if that codeword bit participates in the parity check equation of that error correction syndrome bit. In these most preferable embodiments, the computing of the termination indication includes, in response to one of the codeword bit estimates being flipped, updating the error correction syndrome weight in accordance with the flips of the error correction syndrome bits that are influenced by the codeword bit estimate that is flipped. In some most preferable embodiments, the flipping of the bit(s) of the error correction syndrome that is/are influenced by the codeword bit flip and/or the updating of the error correction syndrome weight is substantially simultaneous with the codeword bit flip that triggers the updating of the error correction syndrome weight. In other most preferable embodiments, the flipping of the bit(s) of the error correction syndrome that is/are influenced by the codeword bit flip and/or the updating of the error correction syndrome weight is scheduled to be effected subsequent to the codeword bit flip that triggers the updating of the error correction syndrome. Such scheduling may include storing, in a queuing buffer such as a FIFO buffer, requests to flip every error correction syndrome bit that is influenced by the codeword bit flip. Optionally, if the queuing buffer overflows, the decoding method reverts to one of the conventional methods of terminating decoding that are discussed above. In some most preferable embodiments, the error correction syndrome is initialized before any of the iterations of the algorithm. In other most preferable embodiments, the iterations during which the termination indication is computed all are subsequent to the first iteration of the algorithm, and the error correction syndrome is initialized during the first iteration of the algorithm. Such initializing may be combined with, and performed substantially simultaneously with, pre-scheduled flipping of error correction syndrome bits in response to the flipping of codeword bit estimates in the first iteration.

Preferably, during each iteration during which the termination indication is computed, at least a partial update of a checksum syndrome of the codeword bit estimates is computed.

A decoder for implementing the first basic method for decoding a representation of a codeword that includes a plurality of codeword bits includes circuitry for implementing the basic method.

In one embodiment, the circuitry includes a plurality of XOR gates for computing all of a plurality of bits of an error correction syndrome and an OR gate for combining the outputs of the XOR gates.

In embodiments of the decoder intended for a code, such as a binary linear block code, for which an error correction syndrome of the codeword bit estimates is defined, the termination indication includes the weight of the error correction syndrome. Preferably, the testing of the termination indication includes comparing the weight of the error correction syndrome to a threshold, and the computing of the termination indication includes, in response to one of the codeword bit estimates being flipped, changing the sign of every bit of the error correction syndrome that is influenced by that codeword bit estimate. For convergence detection, the threshold is zero. In many of these embodiments, the circuitry includes an error correction syndrome update block for updating both the bits of the error correction syndrome and the weight of the error correction syndrome in response to flips of the codeword bit estimates. In many of these embodiments, the circuitry includes a plurality of registers for storing the bits of the error correction syndrome, so that the updates of the error correction syndrome bits and of the error correction syndrome weight can be simultaneous with the updates of the codeword bits. In others of these embodiments, the circuitry includes, instead of such registers, a random access memory for storing the bits of the error correction syndrome and a queuing buffer such as a FIFO buffer for scheduling the updates of the error correction bits and of the error correction syndrome weight, because if only a small portion of the codeword bit estimates are expected to be flipped when updated, then the updates of the error correction syndrome bits and of the error correction syndrome weight may be delayed relative to the updates of the codeword bits.

Some preferred embodiments of the decoder also include circuitry for, during each iteration of the decoding algorithm in which the termination indication is computed, effecting at least a partial update of a checksum syndrome of the codeword bit estimates.

A second basic method responds to the flipping of the estimate of a codeword bit during an iteration of an iterative decoding algorithm by updating a termination indication that is a function of a syndrome of the codeword bit estimates and testing the updated termination indication. As in the first basic method, the termination indication can be a convergence indication that is tested to determine whether the algorithm has converged by producing a valid codeword or a divergence indication that is tested to determine whether the algorithm is likely to not converge. In the case of the termination indication being a convergence indication, this method is distinguished from the first conventional convergence detection method discussed above by updating the convergence indication in response to a codeword bit flip rather than in response to finishing an iteration, and from the second conventional convergence detection method discussed above by the convergence indication being updated rather than being re-set in response to codeword bit flips.

Preferably, if the testing shows that the algorithm has converged, the decoding is terminated. Additionally or alternatively, if the testing indicates that the algorithm is likely to not converge, the decoding is terminated.

Preferably, the termination indication is a function of a weight of the syndrome prior to the flipping of the codeword bit estimate and of each syndrome bit that is influenced by that codeword bit estimate.

Preferably, the updating and the testing are effected before continuing the iteration. For example, if the iterative decoding algorithm is a LDPC message passing algorithm that, in each iteration, traverses all the parity-check nodes, and a codeword bit estimate is flipped as a result of the message passing associated with one of the parity-check nodes, then the termination indication is updated and tested before any message are passed from any subsequent parity-check nodes.

A decoder for implementing the second basic method for decoding a representation of a codeword that includes a plurality of bits includes circuitry for implementing the second basic method.

BRIEF DESCRIPTION OF THE DRAWINGS

Various embodiments are herein described, by way of example only, with reference to the accompanying drawings, wherein.

DESCRIPTION OF THE PREFERRED EMBODIMENTS

The principles and operation of fast decoder convergence detection according to the present invention may be better understood with reference to the drawings and the accompanying description.

The methods described herein allow for real-time convergence detection in iterative decoders. The common property of all of these methods is that the impact of each codeword bit that is flipped during the decoding of the syndrome vector and syndrome weight is calculated in real time (or almost in real time) by flipping all the syndrome bits corresponding to parity checks in which the flipped bit participates.

Figure 2:
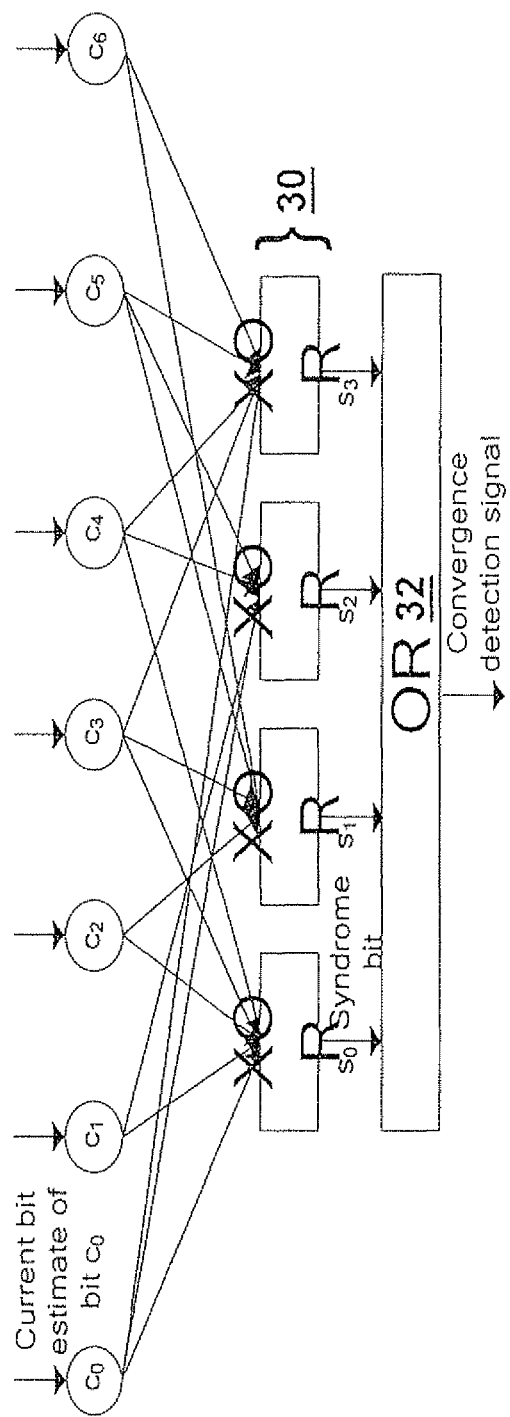
FIG. 2 illustrates less preferred circuitry for real-time decoder convergence detection.

Returning now to the drawings, a straightforward implementation of real-time convergence detection is shown in FIG. 2. Each parity check equation is represented by an XOR gate 30 whose inputs are the current bit estimates (represented as the circles in FIG. 2) of the bits participating in the parity-check equation. Each check equation XOR gate 30 outputs one of the syndrome bits. An OR operation is performed on the syndrome bits to produce a convergence detection signal. As soon as the convergence detection signal equals zero, the bit estimates constitute a valid codeword and the decoding can be terminated.

The implementation depicted in FIG. 2 is simple, but may be costly in terms of silicon area and power, especially for long codes. The main reason is the complex interconnect layer which computes the syndrome bits, which may not be feasible for implementation in long codes. Note that codes used in iterative coding schemes are usually based on a sparse parity check matrices (hence the name "Low-Density" Parity-Check codes). This means that each bit participates in a small number of parity-check equations (usually between three and six parity checks on the average). This in turn simplifies the interconnect layer used for computing the syndrome bits. On the other hand, iterative coding schemes are usually based on very long codes. Hence, overall, the interconnect layer may still be too complex for the implementation illustrated in FIG. 2.

Figure 1:
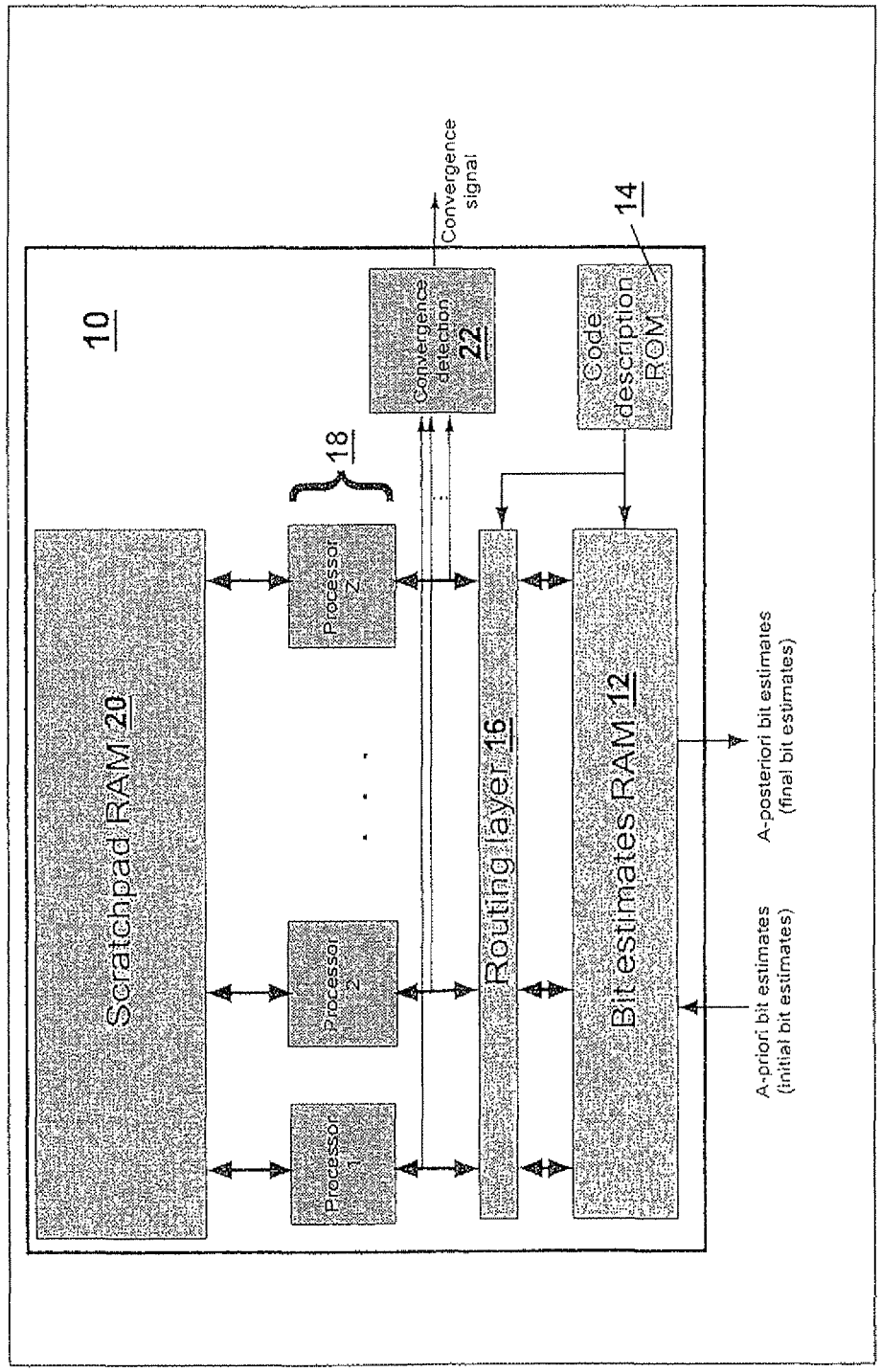
FIG. 1 is a block diagram of an exemplary iterative decoder.
Figure 3:
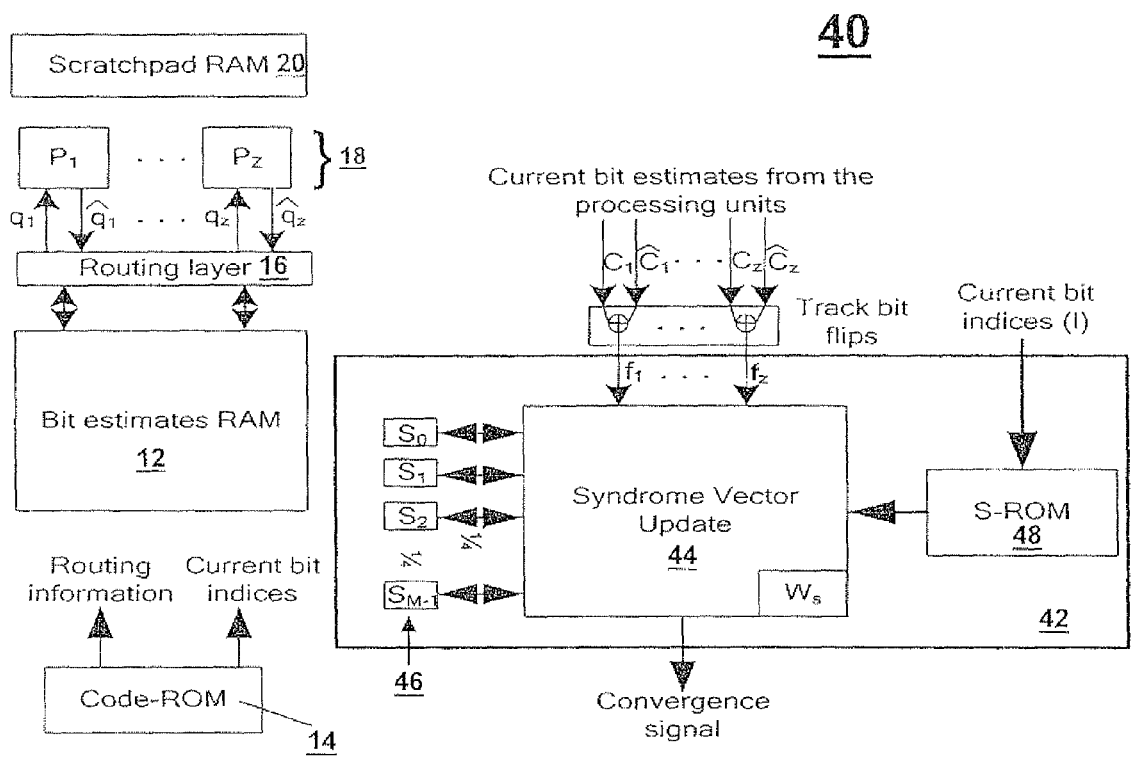
FIGS. 3 and 5 illustrate decoders with more preferred circuitry for real-time decoder convergence detection.

Alternative circuitry for implementing real time convergence detection block, that does not require the complex interconnect layer of FIG. 2, is shown in FIG. 3. Decoder 40 of FIG. 3 is identical to decoder 10 of FIG. 1, except for the substitution of convergence detection block 42 for conventional convergence detection block 22. Let $I=[i_1\ i_2\ \ldots\ i_z]$ denote the indices of the set of bits whose "soft" bit estimates are currently updated by the decoder's Z processing units 18. Let $Q=[q_1\ q_2\ \ldots\ q_z]$ and $\hat{Q}=[\hat{q}_1\ \hat{q}_2\ \ldots\ \hat{q}_z]$ denote the "soft" bit estimates of these bits, prior to and after their updating by the processing units, respectively. Let $C=[c_1\ c_2\ \ldots\ c_z]$ and $\hat{C}=[\hat{c}_1\ \hat{c}_2\ \ldots\ \hat{c}_z]$ denote the corresponding "hard" decisions (i.e. 0/1 bit values) of Q and $\hat{Q}$, respectively. Let $F=[f_1=c_1\oplus\hat{c}_1\ \ldots\ f_z=c_z\oplus\hat{c}_z]^T$ denote a column vector of bit flip indicators (i.e. f=1 if the corresponding bit flipped its value and 0 otherwise). Let $S=[s_0\ s_1,\ \ldots,\ s_{M-1}]^T$ denote the syndrome vector (as a column vector) and $W_s$ the syndrome weight counter. Convergence detection block 42 operates as follows:

1) The syndrome vector S and the syndrome weight counter $W_s$ are reset to zero prior to decoding.
2) The initial syndrome vector and the initial syndrome weight are computed during decoder initialization based on the initial a-priori bit estimates.
3) Each time a new set of bit estimates is computed by processing units 18 (e.g. each clock), the syndrome vector S and the syndrome weight counter $W_s$ are updated accordingly. This is done by the syndrome vector update block 44, which updates the relevant set of syndrome bits corresponding to parity-check constraints in which the current set of bits (with indices in I) participates.

The syndrome vector is stored in an array 46 of registers (in order to allow access and updating of any number of syndrome bits simultaneously). An S-ROM 48 stores the columns of the code's parity-check matrix H. In this case, syndrome vector update block 44 updates the syndrome vector as follows: $S=S\oplus(H(I)\cdot F)$, where H(I) is a M×Z submatrix, of the code's parity-check matrix H, that include only the columns with indices in I. Alternatively, $S=S\oplus H(I_{f=1})$, where $I_{f=1}$ is a subset of the indices set I including only the indices of the bits which flipped sign (i.e. bits for which f=1).

Note that in iterative coding schemes, like the ones based on LDPC codes, the parity-check matrix H is sparse and the average number of 1's in a column of H is small (typically between three and six), while the dimension M of H may be a few hundreds or thousands or more (i.e. a bit participates on the average in only between three and six parity-checks out of the M parity-checks of the code). Hence, instead of storing the columns of H in S-ROM 48, it may be more efficient, both in terms of S-ROM size and in terms of the syndrome vector update complexity, to store only the indices of the syndrome bits in which each codeword bit participates. This way, given a set of codeword bit indices I, S-ROM 48 outputs a set of syndrome bit indices J(I), corresponding to the parity-checks in which the codeword bits participate. Furthermore, it is common to use LDPC codes (e.g. quasi-cyclic LDPC codes) whose parity-check matrix H is arranged such that each set of bits that is processed simultaneously doesn't participate in common parity-checks. In other words, if $i_1,i_2\in I$ then $J(i_1)\cap J(i_2)=\emptyset$. In this case the syndrome vector updating may be done simply by flipping the relevant syndrome bits as follows: $S(J(I_{f=1}))=NOT\ (S(J(I_{f=1})))$, where S(J) denotes a subset of the syndrome bits in S with indices J.

The syndrome weight is updated in conjunction with updating of the syndrome vector. The syndrome weight is simply the sum of the elements of the syndrome vector. The syndrome weight can be updated in an incremental manner: $W_s=W_s+N_{0\to 1}-N_{1\to 0}$, where $N_{0\to 1}$ is the number of syndrome bits that flipped from 0 to 1 in the current syndrome vector updating step and $N_{1\to 0}$ is the number of syndrome bits flipped from 1 to 0 in the current syndrome vector updating step. Decoding is terminated as soon as $W_s=0$, as this indicates that the syndrome vector is zeroed and that the decoder has converged to a valid codeword.

Figure 4:
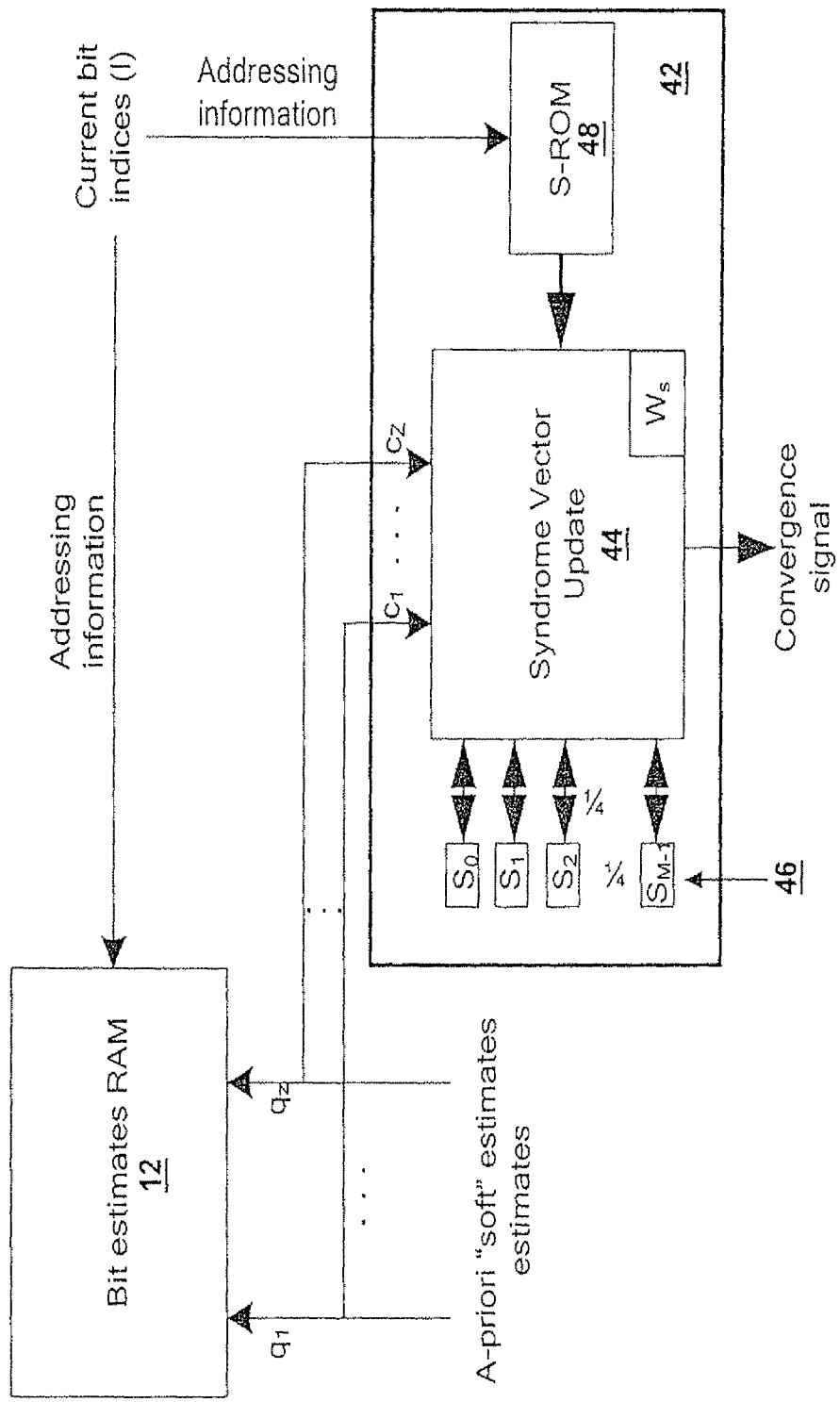
FIG. 4 shows how the syndrome vector update block of FIG. 3 is used to initialize the syndrome vector.

Initialization of the syndrome vector can be performed as follows: prior to decoding, the syndrome vector is reset and initialized with 0's. Then, the initial syndrome vector may be computed during decoder initialization, while filling bit estimates RAM 12 with the initial a-priori "soft" bit estimates. This can be done using syndrome vector update block 44 of FIG. 3, as shown in FIG. 4. The only difference is that during initialization, syndrome vector update block 44 is driven by the vector of a-priori bit estimates, while during decoding syndrome vector update block 44 is driven by the vector of bit flips. Note that in the context of FIG. 4, all bit indices I are "current". Also note that in the context of FIG. 4, the parameter "Z" denotes the number of a-priori "soft" bit estimates that are loaded simultaneously into bit estimates RAM 12.

Real-time convergence detection block 42 of FIG. 3 is less complex and less power consuming than the real time convergence detection circuitry of FIG. 2. However, convergence detection block 42 may still incur relatively high implementation complexity. The main reason is that many syndrome bits may need to be updated simultaneously. As a result the syndrome vector cannot be stored in a low cost RAM (which would allow access to one or at most two addresses simultaneously) and needs to be stored in array 46 of M registers (where M can be on the order of a few hundreds or thousands or more. Moreover, a large number of simultaneous XOR operations is needed ($S=S\oplus H(I_{f=1})$, requires up to Z*M XOR operations). Alternatively, a small number of simultaneous NOT operations may be performed ($S(J(I_{f=1}))=NOT(S(J(I_{f=1}))))$, but then a large MUXing layer for choosing the small number of syndrome bits (whose indices are $J(I_{f=1})$) out of the total of M syndrome bits should be implemented.

Figure 5:
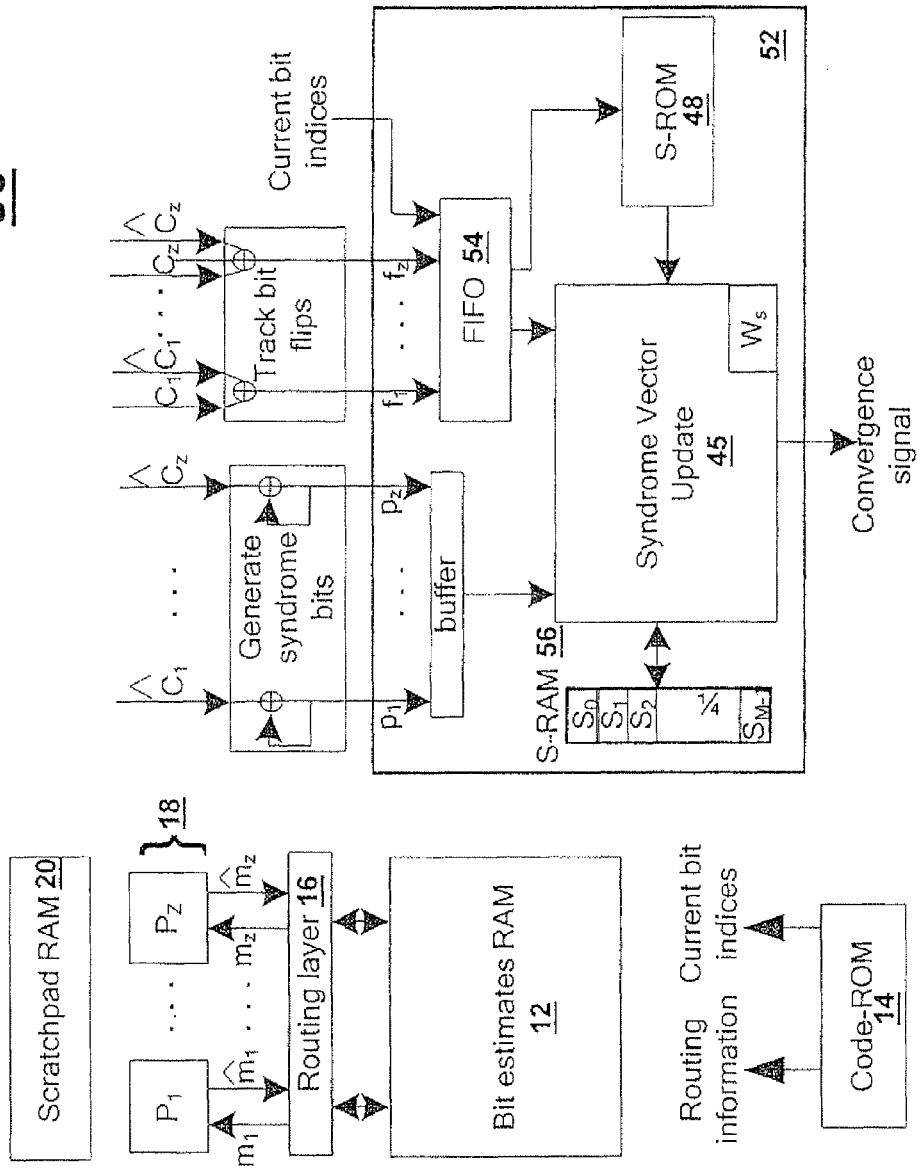

In order to reduce the complexity and power consumption of real time convergence detection block 42 of FIG. 3, a different solution, shown in FIG. 5, can be used. Decoder 50 of FIG. 5 is identical to decoder 40 of FIG. 3 except for the substitution of convergence detection block 52 for convergence detection block 42. This solution is based on the observation that during decoding of a sparse parity-check matrix, the average frequency of bit flips is very low. On average, at bit error rates common in Flash memories, a bit may flip once every 10 to 20 decoding clocks. There may still be a burst where several bits flip simultaneously (i.e. in a single clock, or in consecutive clocks), however this is a low probability event. Now, each bit flip requires updating only a few syndrome bits (due to the sparseness of the parity-check matrix), in order to keep the syndrome vector updated. Hence, since bit flips occur at low frequency, a FIFO buffer 54 can be used for storing and managing the bit flip "requests", such that the syndrome vector updating will be done at low frequency, one or a few (e.g. Z) syndrome bits at a time. The advantage of this approach is that we obtain near real-time convergence detection, while having very low complexity and low power consumption. More specifically, the solution depicted in FIG. 5 does not require storing the syndrome vector in an array of registers—the syndrome vector can be stored in a low cost RAM (depicted as S-RAM 56 in FIG. 5), as the syndrome vector is updated one or a few (Z) bits at a time. Moreover, there is no need for a large MUXing layer and the amount of logic is very low, as we need to flip only one or a few (e.g. Z) syndrome bits at a time. Syndrome vector update block 45 of convergence detection block 52 is syndrome vector update block 44 of convergence detection block 42, modified to manipulate the syndrome bits in SRAM 56, in response to requests from FIFO buffer 54, instead of in registers 46.

According to convergence detection block 52 of FIG. 5, each time bit flipping is identified within the set of Z soft bit estimates that were updated by processing units 18, a request is inserted in FIFO buffer 54 for flipping the appropriate syndrome bits. This request includes a specification of which out of the Z bits flipped (e.g. Z indicator bits) and the indices (or index) of the current group of bits that generated the request. Syndrome vector update block 45 handles the request in FIFO buffer 54 one by one, as long as FIFO buffer 54 is not empty. Each request may be handled in several processing clocks. For example, if the flipped bit (or flipped bits within the set of Z simultaneously processed bits) that generated the request participates in d parity-checks, then the request may be handled in d clocks, such that in each clock, S-ROM 48 outputs the address A of one syndrome bit (or one set of Z syndrome bits) within S-RAM 56, corresponding to one of the d parity-checks in which the bit(s) participate(s). The syndrome bit(s) at the address(es) is/are updated according to the indicator vector that was stored in FIFO buffer 54 (e.g. S-RAM(A)=S-RAM(A)⊕F). Additionally, the syndrome weight is updated incrementally: $W_s=W_s+N_{0\to1}-N_{1\to0}$, where $N_{0\to1}$ is the number of syndrome bits that flipped from 0 to 1 at the updated S-RAM address(es) A and $N_{1\to0}$ is the number of syndrome bits that flipped from 1 to 0 at the updated S-RAM address(es) A.

In order to avoid overflow of FIFO buffer 54 in case of a "burst" of bit flip requests (where each one requires several clocks to process), a sufficiently large FIFO buffer 54 should be allocated. Alternatively, a smaller FIFO buffer 54 can be used, and then in the (low probability) event that FIFO buffer 54 overflows, real-time convergence detection block 52 can be disabled. In this case decoder 50 may run until a maximal number of iterations, or revert to any one of the conventional convergence detection methods.

Initialization of the syndrome vector in S-RAM 56 can be done as shown in FIG. 4, during the initialization of decoder 50, while filling bit estimates RAM 12 with the initial a-priori "soft" bit estimates. However, this would require the high complexity convergence detection block 42 of FIG. 3. In order to avoid this, the initial syndrome vector can be computed one or few (e.g. Z) syndrome bits at a time, during the first decoding iteration, as during the first decoding iteration all the parity-checks are processed anyway. For example, consider a decoder operating according to a serial updating schedule, where the parity-checks of the code are processed one set of Z parity-cheeks after another, such that a parity-check involving r bits is processed in r clocks. In this case, the syndrome vector initialization is done as follows: prior to decoding, the syndrome vector storage (i.e. S-RAM 56) is initialized with 0's. Then during the first decoding iteration, after each r clocks, an additional set of Z syndrome bits (P=[$p_1 \ldots p_z$] in FIG. 5) is computed and the syndrome vector and syndrome weight counter are updated accordingly. i.e., S-RAM(n)=S-RAM(n)⊕P, where n is a serial address counter that is incremented once every r clocks. Note that during the first iteration S-RAM 56 is updated by two sources: 1) the generate syndrome bits source (S-RAM(n)=S-RAM(n)⊕P) 2) the track flip bits source (S-RAM(A)=S-RAM(A)⊕F). Once the first iteration finishes, the syndrome vector and syndrome weight counter are valid. From that point onwards, only the track flip bits source updates the syndrome vector and syndrome weight counter and once the syndrome weight counter reaches zero, convergence is detected and decoding is terminated.

Note that because there are two sources updating the syndrome vector during the first decoding iteration, the track flip bits source should update only syndrome bits of previously processed parity-checks. Starting from the second iteration until decoding termination, the track flip bits source updates all the syndrome bits.

According to this low complexity syndrome vector initialization approach, convergence detection block 52 becomes valid as a fast convergence detector only after the first decoding iteration finishes. However, this is OK as decoder 50 is not expected to converge in less than one iteration anyway (unless the number of errors is zero or almost zero).

Up to this point, the use of convergence detection blocks 42 and 52, as their name implies, has been described for early detection of convergence. A simple modification of convergence detection blocks 42 and 52 turns them into divergence detection blocks. Instead of comparing $W_s$ to zero, $W_s$ is compared to a non-zero threshold. Typically, this threshold is the value of $W_s$ at a corresponding point in the immediately preceding iteration. Alternatively, this threshold could be a value that $W_s$ is expected to not exceed at a given point in the iterative decoding if the iterative decoding is expected to converge.

Figure 6:
FIG. 6 is a block diagram of an encoder that uses both a checksum and an ECC.

The technology described herein can also be used for fast testing of a checksum. A checksums is a code that is used for error detection. When implemented together with Error Correcting Codes, a system may achieve error rates of less than $10^{-14}$ for detected errors and less than $10^{-20}$ for undetected errors. A typical encoder employing a checksum and an ECC is illustrated in FIG. 6. In FIG. 6, the output of the checksum encoder is a partial codeword that consists of the information bits concatenated with a checksum and the output of the ECC encoder is a full codeword that consists of the partial codeword concatenated with the ECC parity bits.

Typically, a checksum is implemented using a Cyclic Redundancy Code (CRC). A CRC is a cyclic code that ensures that certain patterns of errors will be detected. Patterns detected by a CRC may include all odd number of errors, burst errors up to a given burst length, and many other types of errors.

Typically, a CRC is encoded by embedding the information bits in a polynomial p(x), and multiplying by a generator polynomial g(x) in a certain polynomial ring to generate a code polynomial c(x).

A CRC may be used for error detection by computing its syndrome, which simplifies to multiplying the representation of the code polynomial c(x) by a check polynomial h(x), and success is declared if c(x)·h(x)=0, (in the polynomial ring). The process of computing the syndrome of the CRC via polynomial multiplication is simple, however it cannot be done on-the fly during conventional ECC decoding. It can only be done after the ECC decoder finishes; hence it incurs additional decoding latency. In order to avoid this drawback, the methods of real-time Syndrome computation described herein can be applied to real-time, on-the-fly, checksum computation.

Figure 7:
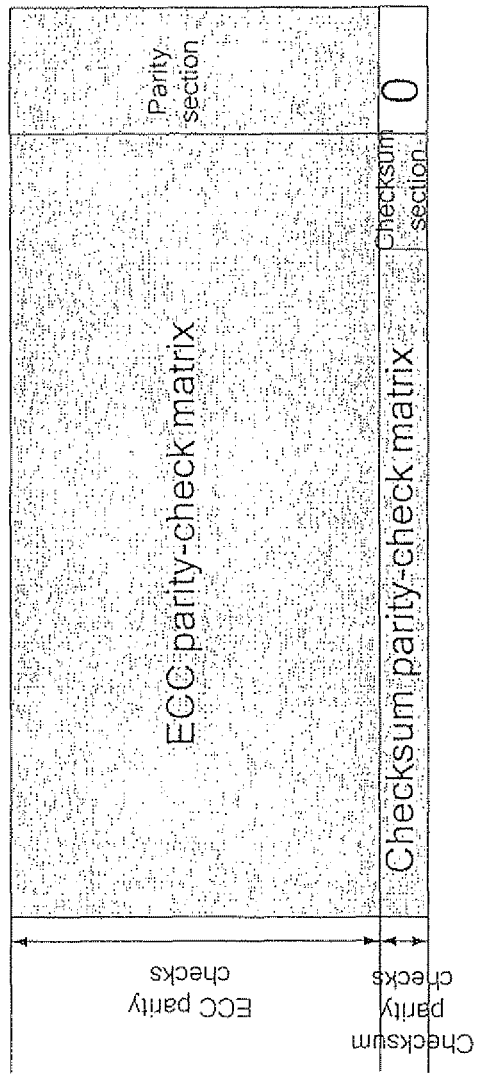
FIG. 7 illustrates an expanded matrix for joint real-time decoder convergence detection and checksum computation.

Just as a ECC parity-check matrix H is defined for a codeword (the output of the ECC encoder of FIG. 6), so a checksum parity-check matrix may be defined for the partial codeword that is output from the checksum encoder of FIG. 6. In order to do real-time error detection, the checksum parity-check matrix is appended to the parity-check matrix of the ECC. In other words, the parity-check matrix of the ECC is extended by adding rows related to the parity-check matrix of the checksum. Since the ECC parity bits do not participate in the checksum code, all values relating to ECC parity bits are 0 in the additional rows that are related to the checksum. The expanded matrix has the form shown in FIG. 7.

Now that a single unified parity-check matrix is defined for the checksum and the ECC, the methods described above can be used for computing a joint syndrome vector for both the checksum and ECC. The first M elements of the joint syndrome vector constitute the ECC syndrome vector S. The remaining elements of the joint syndrome vector constitute the CRC syndrome vector. In the appended claims, the ECC syndrome vector is called the "error correction" syndrome and the CRC syndrome vector is called the "checksum" syndrome. Note that in iterative coding schemes the ECC parity-check matrix is usually sparse, while the checksum parity-check matrix should be dense. Hence, it may be efficient to use the mechanism depicted in FIG. 5 for updating the ECC syndrome vector (as it is based on the sparseness of the parity-check matrix) and to use the mechanism depicted in FIG. 3 for updating the CRC syndrome vector.

A limited number of embodiments of methods for fast detection of convergence (or likely non-convergence) of an iterative decoder, and of decoders that use the methods, have been described. It will be appreciated that many variations, modifications and other applications of the methods and decoders may be made.

What is claimed is:

1. A method of decoding a representation of a codeword that includes a plurality of codeword bits, comprising:
   (a) during at least one iteration, of an iterative decoding algorithm, in which respective estimates of the codeword bits are updated according to a message-passing schedule, computing a termination indication of the algorithm using a processing unit; and
   (b) testing the termination indication to determine whether to terminate the decoding;
   wherein the testing of the termination indication shows whether to terminate the decoding despite at least one of the respective estimates of the codeword bits having flipped during an immediately preceding traversal of the message-passing schedule.

2. The method of claim 1, further comprising:
   (c) if the testing of the termination indication indicates that the algorithm has converged, terminating the decoding.

3. The method of claim 1, further comprising:
   (c) if the testing of the termination indication indicates that the algorithm is likely to not converge, terminating the decoding.

4. The method of claim 1, wherein, during each of the at least one iteration, the testing of the termination indication is effected whenever a respective estimate of a codeword bit is flipped.

5. The method of claim 1, wherein the computing of the termination indication includes OR-ing all of a plurality of bits of an error correction syndrome.

6. The method of claim 1, wherein the termination indication includes a weight of an error correction syndrome, of the estimates of the bits of the codeword, that includes a plurality of error correction syndrome bits, and wherein the testing includes comparing the weight of the error correction syndrome to a threshold.

7. The method of claim 6, wherein the threshold is zero.

8. The method of claim 6, wherein the computing of the termination indication includes, in response to a flipping of one of the respective estimates of the codeword bits, flipping every error correction syndrome bit that is influenced by the one of the respective estimates of the codeword bits.

9. The method of claim 8, wherein the flipping of every error correction syndrome bit that is influenced by the one of the respective estimates of the codeword bits is substantially simultaneous with the flipping of the one of the respective estimates of the codeword bits.

10. The method of claim 8, further comprising:
    (c) scheduling the flipping of every error correction syndrome bit that is influenced by the one of the respective estimates of the codeword bits, in response to the flipping of the respective estimate of the one of the codeword bits, to be effected subsequent to the flipping of the one of the respective estimates of the codeword bits.

11. The method of claim 10, wherein the scheduling includes storing, in a queuing buffer, requests to flip every error correction syndrome bit that is influenced by the flipping of the respective estimate of the one codeword bit.

12. The method of claim 11, further comprising:
    (d) if the queuing buffer overflows, reverting to a conventional method of terminating the decoding.

13. The method of claim 8, wherein the computing of the termination indication includes, in response to a flipping of the one of the respective estimates of the codeword bits, updating the weight of the error correction syndrome in accordance with the flip of every error correction syndrome bit that is influenced by the one of the respective estimates of the codeword bits.

14. The method of claim 13, wherein the updating of the weight of the error correction syndrome is substantially simultaneous with the flipping of the one of the respective estimates of the codeword bits.

15. The method of claim 13, further comprising:
    (c) scheduling the updating of the weight of the error correction syndrome, in response to the flipping of the respective estimate of the one of the codeword bits, to be effected subsequent to the flipping of the one of the respective estimates of the codeword bits.

16. The method of claim 15, wherein the scheduling includes storing, in a queuing buffer, requests to flip every error correction syndrome bit that is influenced by the flipping of the respective estimate of the one codeword bit.

17. The method of claim 16, further comprising:
    (d) if the queuing buffer overflows, reverting to a conventional method of terminating the decoding.

18. The method of claim 8, further comprising:
    (c) prior to any of the iterations in which the termination indication is computed, initializing the error correction syndrome.

19. The method of claim 8, wherein all of the at least one iteration are subsequent to a first iteration of the iterative decoding algorithm, and wherein the method further comprises:
    (c) initializing the error correction syndrome during the first iteration of the iterative decoding algorithm.

20. The method of claim 19, further comprising:
    (d) scheduling the flipping of error correction syndrome bits in response to the flipping of the respective estimate of one of the codeword bits, to be effected subsequent to the flipping of the one of the respective estimates of the codeword bits;

and wherein the initializing of the error correction syndrome is effected substantially simultaneously with the flipping of the error correction syndrome bits in response to the flipping of the estimates of the codeword bits.

21. The method of claim 1, further comprising:
(c) during each of the at least one iteration of the iterative decoding algorithm, effecting at least a partial update of a checksum syndrome of the estimates of the bits of the codeword.

22. A decoder, for decoding a representation of a codeword that includes a plurality of codeword bits, comprising circuitry for:
(a) during at least one iteration, of an iterative decoding algorithm, in which respective estimates of the codeword bits are updated according to a message-passing schedule, computing a termination indication of the algorithm; and
(b) testing the termination indication to determine whether to terminate the decoding;
wherein the testing of the termination indication shows whether to terminate the decoding despite at least one of the respective estimates of the codeword bits having flipped during an immediately preceding traversal of the message-passing schedule.

23. The decoder of claim 22, wherein the circuitry includes a plurality of XOR gates for computing all of a plurality of bits of an error correction syndrome and an OR gate for combining outputs of the XOR gates.

24. The decoder of claim 22, wherein the termination indication includes a weight of an error correction syndrome, of the estimates of the bits of the codeword, that includes a plurality of bits, wherein the testing includes comparing the weight of the error correction syndrome to a threshold, and wherein the computing of the termination indication includes, in response to a flipping of one of the respective estimates of the codeword bits, flipping every bit, of the error correction syndrome, that is influenced by the one of the respective estimates of the codeword bits.

25. The decoder of claim 24, wherein the threshold is zero.

26. The decoder of claim 24, wherein the circuitry includes an error correction syndrome update block for updating the bits of the error correction syndrome and the weight of the error correction syndrome in response to flips of the respective estimates of the codeword bits.

27. The decoder of claim 24, wherein the circuitry includes a plurality of registers for storing the bits of the error correction syndrome.

28. The decoder of claim 24, wherein the circuitry includes a random access memory for storing the bits of the error correction syndrome and a queuing buffer for scheduling the updates of the error correction syndrome bits and the weight of the error correction syndrome.

29. The decoder of claim 22, further comprising:
(c) circuitry for, during each of the at least one iteration of the iterative decoding algorithm, effecting at least a partial update of a checksum syndrome of the estimates of the bits of the codeword.

30. A method of decoding a representation of a codeword that includes a plurality of codeword bits, comprising: during each of at least one iteration of an iterative decoding algorithm: in response to a flipping of a respective estimate of one of the codeword bits:
(a) updating a termination indication, using a processing unit, that is a function of a syndrome of the estimates of the codeword bits, the syndrome including a plurality of syndrome bits; and
(b) testing the termination indication.

31. The method of claim 30, further comprising:
(c) if the testing of the termination indication shows that the algorithm has converged, terminating the decoding.

32. The method of claim 30, further comprising:
(c) if the testing of the termination indication indicates that the algorithm is likely to not converge, terminating the decoding.

33. The method of claim 30, wherein the termination indication is a function of
(i) a weight of the syndrome prior to the flipping of the respective estimate of the one codeword bit, and
(ii) each syndrome bit that is influenced by the respective estimate of the one codeword bit.

34. The method of claim 30, wherein the updating and the testing are effected before continuing the each iteration.

35. A decoder, for decoding a representation of a codeword that includes a plurality of codeword bits, comprising circuitry for, during each of at least one iteration of an iterative decoding algorithm: in response to a flipping of a value of a respective estimate of one of the codeword bits:
(a) updating a termination indication that is a function of a syndrome of the estimates of the codeword bits, the syndrome including a plurality of syndrome bits; and
(b) testing the termination indication.

* * * * *